United States Patent
Nakamura et al.

(10) Patent No.: US 7,974,130 B2
(45) Date of Patent: Jul. 5, 2011

(54) SEMICONDUCTOR MEMORY DEVICE AND METHOD FOR ERASING THE SAME

(75) Inventors: Dai Nakamura, Kawasaki (JP); Koji Hosono, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 348 days.

(21) Appl. No.: 11/944,803

(22) Filed: Nov. 26, 2007

(65) Prior Publication Data

US 2008/0137409 A1 Jun. 12, 2008

(30) Foreign Application Priority Data

Nov. 28, 2006 (JP) ................................ 2006-319428

(51) Int. Cl.
*G11C 16/06* (2006.01)
(52) U.S. Cl. ........... 365/185.2; 365/185.17; 365/185.18; 365/185.29; 365/185.3
(58) Field of Classification Search ............. 365/185.02, 365/185.17 X, 185.18 X, 185.2 O, 185.29 X, 365/185.3 X, 185.17, 185.18, 185.2, 185.29, 365/185.3
See application file for complete search history.

(56) References Cited

U.S. PATENT DOCUMENTS

| | | | | |
|---|---|---|---|---|
| 6,798,698 B2 * | 9/2004 | Tanaka et al. | | 365/185.22 |
| 6,940,752 B2 | 9/2005 | Tanaka et al. | | |
| 6,987,696 B1 * | 1/2006 | Wang et al. | | 365/185.29 |
| 7,310,280 B2 * | 12/2007 | Park et al. | | 365/210.1 |
| 7,480,178 B2 * | 1/2009 | Park et al. | | 365/185.17 |
| 7,619,930 B2 * | 11/2009 | Mokhlesi | | 365/185.22 |

FOREIGN PATENT DOCUMENTS

| | | |
|---|---|---|
| JP | 2006-186359 | 7/2006 |
| KR | 1993-0009064 | 5/1993 |
| KR | 10-2006-0110755 | 10/2006 |
| WO | WO 2006/025089 A1 | 3/2006 |

* cited by examiner

*Primary Examiner* — VanThu Nguyen
(74) *Attorney, Agent, or Firm* — Oblon, Spivak, McClelland, Maier & Neustadt, L.L.P.

(57) ABSTRACT

A semiconductor memory device including a memory cell array with NAND cell units arranged therein, the NAND cell unit having a plurality of electrically rewritable and non-volatile memory cells connected in series, first and second select gate transistors disposed for coupling the both ends of the NAND cell unit to a bit line and a source line, respectively, and a dummy cell disposed adjacent to at least one of the first and second select gate transistors, wherein after erasing the memory cells in an erase unit, the memory cells excepting the dummy cell are subject to soft-program.

10 Claims, 15 Drawing Sheets

Select Signal at a Test Time   A0-A4

SEMICONDUCTOR MEMORY DEVICE AND METHOD FOR ERASING THE SAME

CROSS-REFERENCE TO RELATED APPLICATION

This application is based on and claims the benefit of priority from the prior Japanese Patent Application No. 2006-319428, filed on Nov. 28, 2006, the entire contents of which are incorporated herein by reference.

BACKGROUND OF THE INVENTION

1. Field of the Invention

This invention relates to a semiconductor memory device with electrically rewritable and non-volatile memory cells, i.e., EEPROM, specifically to a technology of reducing the error-write rate of a NAND-type flash memory.

2. Description of the Related Art

A NAND-type flash memory is known as one of electrically rewritable and highly integrative non-volatile semiconductor memories (EEPROMs). In the NAND-type flash memory, multiple memory cells are connected in series in such a manner that adjacent two memory cells share a source/drain diffusion layer to constitute a NAND cell unit. The both ends of the NAND cell unit are coupled to a bit line and a source line via select transistors, respectively. By use of such a NAND cell unit configuration, it becomes possible to make the unit cell area smaller than a NOR-type flash memory, and achieve a large capacity.

A memory cell of the NAND-type flash memory has a floating gate formed on a semiconductor substrate with a tunnel insulator film interposed therebetween and a control gate stacked above the floating gate with a gate-insulating film interposed therebetween, and stores data in a non-volatile manner in accordance with the charge storage state in the floating gate. Explaining in detail, a binary data storage scheme is used as follows: a high threshold voltage state, which is obtained by injecting electrons into the floating gate, serves as data "0" while a low threshold voltage state, which is obtained by discharging electrons in the floating gate, serves as data "1". Recently, multi-level (e.g., four-level) data storage scheme is used by dividing a write threshold distribution into two or more distributions.

Assuming that all memory cells (or the half) arranged along a selected word line is dealt with a page, data program (or write) of the NAND-type flash memory is performed page by page. In detail, data program is performed as follows: apply program voltage Vpgm to a selected word line, and inject electrons into the floating gate by FN tunneling from the cell channel. At this program time, a NAND cell channel will be controlled in potential via a bit line in accordance with program data "0" or "1" supplied to the bit line.

Explaining in detail, in case of "0" program, a corresponding bit line is set at Vss, and this is transferred to a selected cell's channel via a select gate transistor, which is turned on. In this case, a large electric field is applied between the floating gate and the cell channel, so that electrons are injected into the floating gate. By contrast, in case of "1" program, a corresponding bit line is applied with Vdd, and a selected cell's channel is charged up to Vdd-Vth (Vth: threshold voltage of the select gate transistor) to be set in a floating state. In this case, the cell's channel is boosted by capacitive coupling from the selected word line with Vpgm applied, so that electron injection into the floating gate will be inhibited.

If the cell's channel boost in a "1" program cell (i.e., program-inhibited cell) with Vpgm applied is insufficient, electrons are injected into the floating gate, and undesirable threshold variation will occur. Non-selected word lines are usually applied with program pass voltage (medium voltage) Vm that is lower than Vpgm. If the cell's channel boost is insufficient in these non-selected cells under the non-selected word lines, erroneous program will occur.

In the prior arts, there have been provided some channel voltage control schemes used for suppressing the erroneous program mode in "1" program cells and non-selected cells at a program time as follows:

(1) Self-boost (SB) scheme - - - at a "1" write time, the whole channels in a NAND-cell unit are set in a floating state, and boosted by capacitive coupling from a selected word line.

(2) Local self-boost (LSB) scheme - - - at a "1" write time, a selected cell's channel is boosted in such a state that the selected cell's channel is isolated from the remaining channels.

(3) Erase area self-boost (EASB) scheme - - - assuming that cells are programmed in order from the source line side, unwritten cell area including a currently selected cell and already written cell area are insulated from each other, and boosted independently.

Even if these channel voltage control schemes are adapted, there will be remained such a problem that erroneous program occurs in a cell adjacent to a select gate transistor (specifically, a select gate transistor on the source line side) when the NAND-type flash memory is miniaturized more. At a data program time, the select gate transistor disposed on the source line side is kept off with gate voltage 0V applied. At this time, if a cell adjacent to the select gate transistor is "1" program one (i.e., program-inhibited cell) with program voltage Vpgm applied, gate induced drain leakage (GIDL) current flows at the drain edge of the select gate transistor, and erroneous program occurs in the cell adjacent to the select gate transistor as s result of electron injection into the floating gate due to the GIDL current.

It is known that in case the cell adjacent to the select gate transistor is applied with program pass voltage Vm(<Vpgm), erroneous program occurs as similar to the above described case. Further, it is also known that there is generated an erroneous program in a cell adjacent to the bit line side select gate transistor as described above.

To suppress the above-described erroneous program due to the GIDL current, some methods have been provided as follows: a method for suppressing the GIDL current at the drain edge of the select gate transistor (for example, improving the channel profile); and another method for suppressing the hot electron injection due to GIDL current (for example, widening the distance between the select gate transistor and the memory cell). However, these dealing methods lose the effectiveness as the minimum feature device size becomes more less.

It is one effective method for suppressing the erroneous program to dispose a dummy cell neighboring to a select gate transistor, which is not used for storing data (for example, see JP-A-2006-186359).

Further, it is known a so-called soft-program scheme used for dissolving an over-erase state in erase cells, which have been collectively erased (for example, refer to JP-A-2006-059532). This scheme is important for preventing the cell data from being varied due to capacitive coupling between adjacent cells because it is possible to narrow the data threshold distributions as a whole. Specifically, it becomes important for improving the erroneous program of a miniaturized NAND-type flash memory (specifically, in a multi-level NAND-type flash memory).

However, even if these dummy cell scheme or soft-program scheme is used, there will be remained the erroneous write problem due to the GIDL current in a NAND-type flash memory with a design rule of 60 nm or less.

SUMMARY OF THE INVENTION

According to an aspect of the present invention, there is provided a semiconductor memory device including a memory cell array with NAND cell units arranged therein, the NAND cell unit having a plurality of electrically rewritable and non-volatile memory cells connected in series, first and second select gate transistors disposed for coupling the both ends of the NAND cell unit to a bit line and a source line, respectively, and a dummy cell disposed adjacent to at least one of the first and second select gate transistors, wherein
after erasing the memory cells in an erase unit, the memory cells excepting the dummy cell are subject to soft-program.

According to another aspect of the present invention, there is provided a semiconductor memory device including a memory cell array with NAND cell units arranged therein, the NAND cell unit having a plurality of electrically rewritable and non-volatile memory cells connected in series, first and second select gate transistors disposed for coupling the both ends of the NAND cell unit to a bit line and a source line, respectively, and a dummy cell disposed adjacent to at least one of the first and second select gate transistors, wherein
after erasing the memory cells in an erase unit, the memory cells and the dummy cell are subject to soft-program under such a condition that the number of soft-program cycles of the dummy cell is less than that of the memory cells.

According to still another aspect of the present invention, there is provided a method for erasing a semiconductor memory device including a memory cell array with NAND cell units arranged therein, the NAND cell unit having a plurality of electrically rewritable and non-volatile memory cells connected in series and a dummy cell disposed adjacent to a select gate transistor at one end of the NAND cell unit, including:

pre-programming at least the dummy cell in an erase unit for boosting threshold voltage thereof;

erasing the memory cells and the dummy cell in the erase unit; and soft-programming the memory cells in the erase unit except the dummy cell.

DETAILED DESCRIPTION OF THE EMBODIMENTS

Illustrative embodiments of this invention will be explained with reference to the accompanying drawings below.

Figure 1:
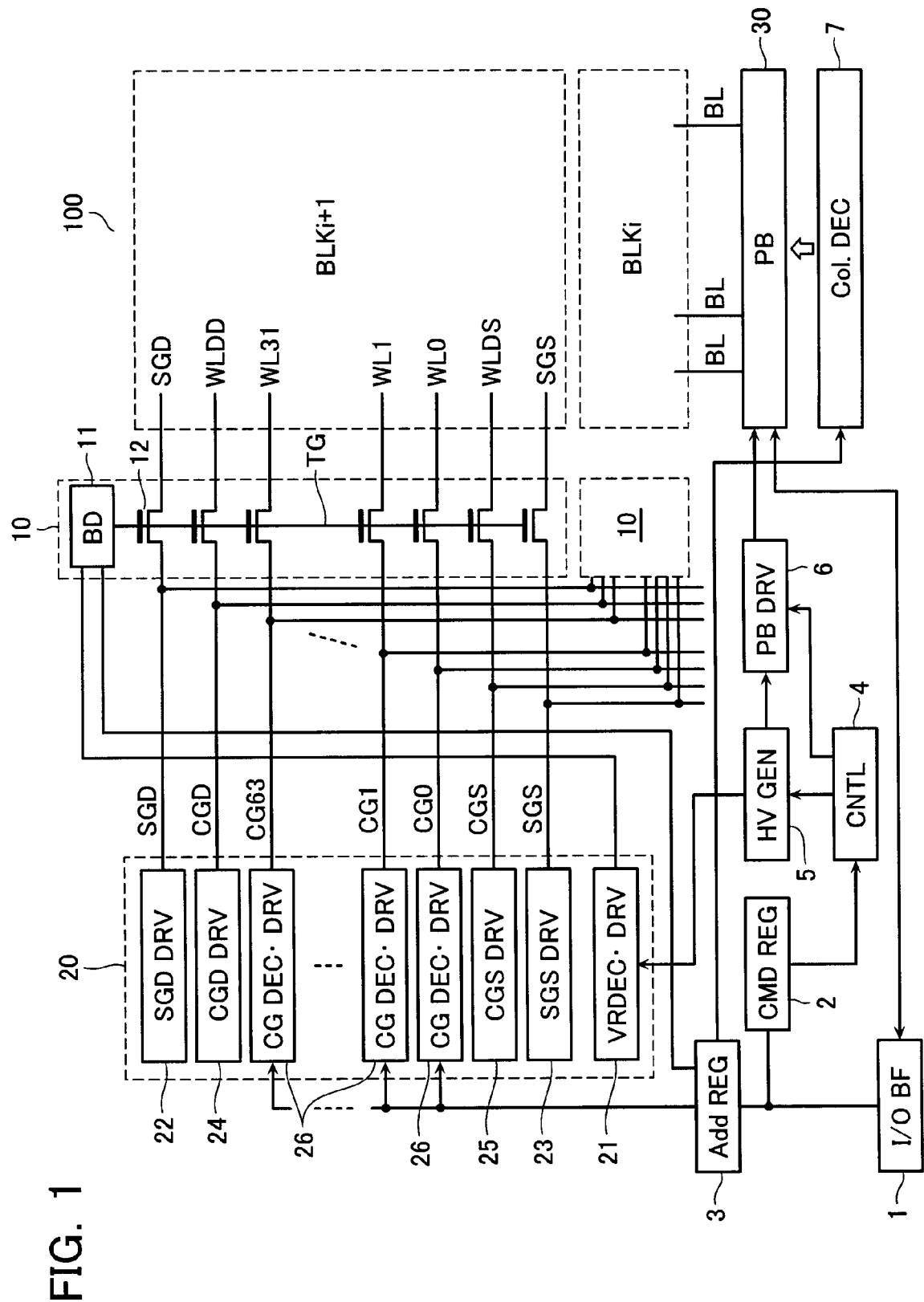
FIG. 1 shows a configuration of a NAND-type flash memory in accordance with an embodiment of the present invention.
Figure 2:
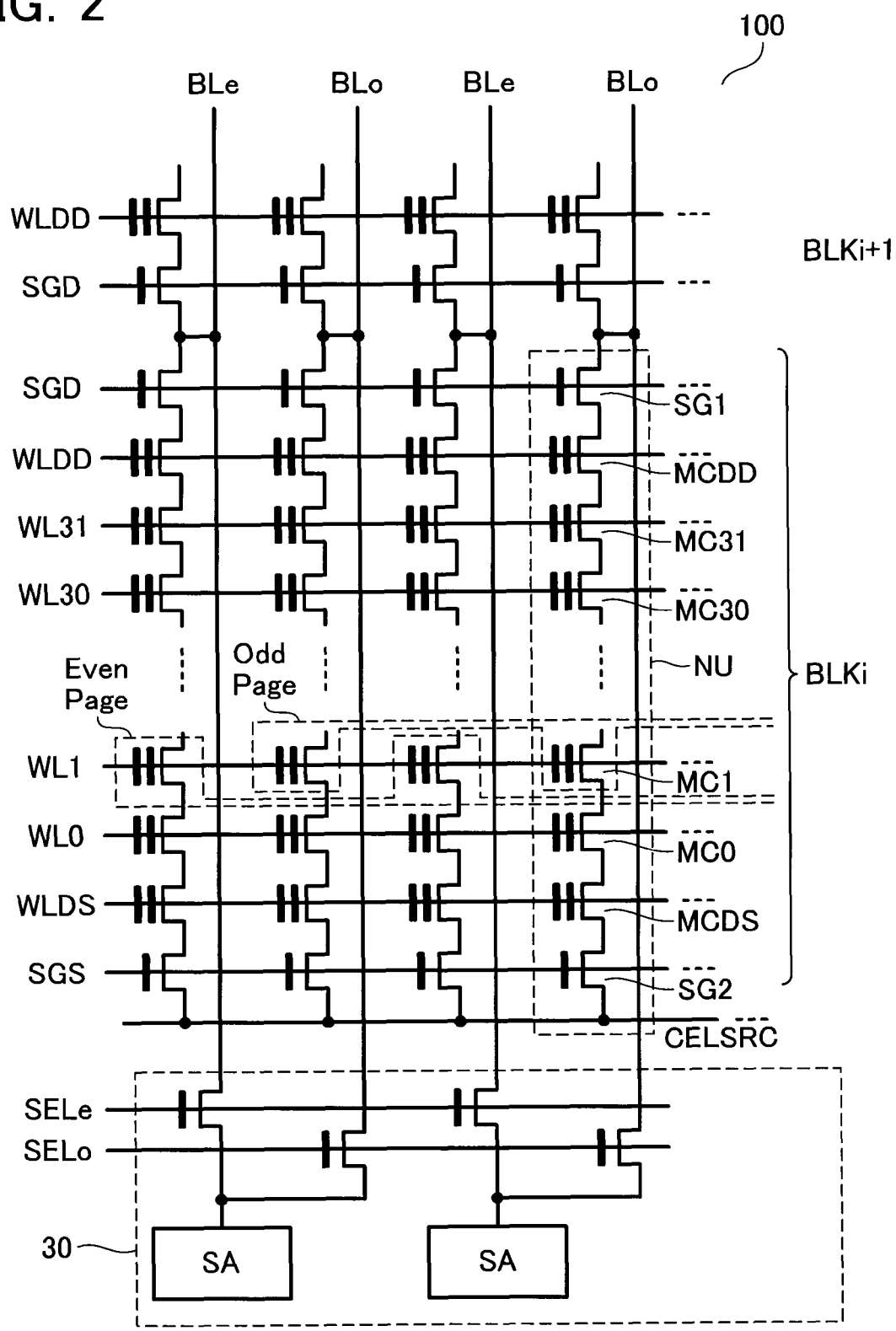
FIG. 2 shows the memory cell array of the flash memory.

FIG. 1 shows a schematic configuration of a NAND-type flash memory device in accordance with an embodiment of the present invention; and FIG. 2 shows the equivalent circuit of the memory cell array 100. A basic unit, NAND cell unit (i.e., NAND string) NU, of the NAND-type flash memory has multiple memory cells MC0-MC31 connected in series and two select gate transistors SG1 and SG2 disposed at both ends thereof.

In this embodiment, dummy cells MCDD and MCDS are disposed adjacent to the select gate transistors SG1 and SG2, respectively, in the NAND cell unit. The dummy cells are formed as similar to the memory cells except that these are not used for storing data, and are not accessible.

One end of the NAND cell unit NU is coupled to a bit line BL via the select gate transistor SG1; and the other end to a common source line CELSRC in the memory cell array 100 via the select gate transistor SG2.

The memory cell has an N-type drain and source diffusion layers formed on a P-type well in a silicon substrate, and a stacked gate structure with a floating gate serving as a charge storing layer and a control gate stacked thereabove. The charge amount in the floating gate is changed through a write or an erase operation, and this leads to threshold voltage change, so that data of one bit or multiple bits will be stored.

Control gates of the memory cells MC0-MC31 and dummy cells MCDD, MCDS are coupled to word lines WL0-WL31 and dummy word lines WLDD, WLDS, respectively; and gates of the select gate transistors SG1 and SG2 to select gate lines SGD and SGS, respectively.

A set of NAND cell units sharing the word lines WL0-WL31, dummy word lines WLDD and WLDS and select gate lines SGD and SGS is defined as a block BLK, which serves as an erase unit. Usually, as shown in FIGS. 1 and 2, multiple blocks (BLKi, BLKi+1, . . . ) are arranged in the direction of the bit line.

The NAND-type flash memory achieves various operations in accordance with the corresponding command inputs. For example, in case of data program (or write), a data load command is latched in a command register 2 via an input/output circuit 1; a program address is latched in an address register 3; and then program data are loaded in a sense amplifier (serving as write circuit). Successively, inputting a program executing command in the command register 2 via the input/output circuit 1, a data program operation starts automatically in the chip.

That is, when the program executing command is input, a sequence controller 4 starts to control a program sequence. At a data program time, the sequence controller 4 controls voltages necessary for data programming; timings of program pulse applications and verify-read operations; and program cycles of the program pulse applications and verify-read operations until a desirable program state is obtained.

A high voltage generating circuit 5 generates program voltage Vpgm; program pass voltage Vpass; and other high voltages (boosted voltages) necessary for a row-system signal driver 20 and a page buffer control circuit 6.

The row-system signal driver 20 includes: CG decoder/drivers 26 for driving word lines, the number of which is equal to that of word lines in a NAND cell unit; SGD driver 22 for driving the drain side select gate line SGD; SGS driver 23 for driving the source side select gate line SGS; CGD, CGS drivers 24, 25 for driving the dummy word lines WLDD, WLDS; and VRDEC driver 21 for outputting a boosted voltage VRDEC used for the block decoders. These drivers 21-26 are shared by multiple blocks.

In the NAND-type flash memory, it is required of multiple word lines in a NAND cell unit to be applied with multiple voltages, and page addresses in a row address are input to the respective CG decoder/drivers 26 for selectively driving the word lines.

Disposed at each block in the memory cell array 100 is a narrow sensed row decoder 10, which has a block selection function. The row decoder 10 includes a block decoder 11, which receives a block address from the address register 3 to decode it, and a transfer transistor array 12, which is driven by the output of the block decoder 11 to transfer voltages necessary for driving the word lines and select gate lines in a selected block. In the block decoder 11, there is contained a level shift circuit for outputting a desirable voltage to the common gate TG of the transistor array 12.

One ends of the transistors in the transistor array 12 are coupled to output nodes of the drivers 21-26 while the other ends are coupled to word lines, dummy word lines and select gate lines in the cell array 100. For example, at a program pulse application time, it is required of a selected word line to be applied with program voltage Vpgm (about 20V). Therefore, at this time, the common gate TG of the transistor array 12 is applied with Vpgm+Vt (Vt: threshold voltage of the transfer transistor), which is supplied from VRDEC driver 21.

In the NAND-type flash memory, it is used an FN tunnel current for programming and erasing. Especially in a program mode, a current necessary for shifting threshold voltage of a memory cell is less than that used in a NOR-type one. Therefore, it becomes possible to program a large amount of memory cells simultaneously in the NAND-type flash memory. In consideration of it, a page length of a program or a read unit may be set at a large value such as 2 kByte or 4 kByte. The sense amplifier 30 includes sense units SA with the same number as the page length.

A column decoder 7 decodes the column address transferred from the address register 3, for example in case of loading write data, and couple the selected sense units SA to the input/output circuit 1 for setting program data in the sense amplifier circuit 30 column by column. In case of read operation, as reversed to the above-described operation, read data, which are collectively read to the page buffer 30, are serially output from selected sense units to the input/output circuit 1 in accordance with column address increment.

Although having omitted in FIG. 1, there is a certain circuit disposed between the input/output circuit 1 and the page buffer 30 for achieving data input/output with certain cycles.

FIG. 2 shows such a sense amplifier scheme that an even numbered bit line BLe and an odd numbered bit line BLo disposed adjacent to each other share a sense unit SA. At a read time or a program time, the even bit line BLe and the odd bit line BLo are selectively coupled to the sense unit SA in accordance with select signals SELe and SELo. Making non-selected bit lines serve as shield lines, the interference between bit liens will be suppressed.

For example, word line WL1 is selected in the sense amplifier scheme shown in FIG. 2. In this case, memory cells selected by the word line WL1 and all even bit lines constitute a page (even page) while memory cells selected by the word line WL1 and all odd bit lines constitute another page (odd page).

As described above, dummy word lines WLDD and WLDS are not selectively accessed unlike the word lines WL0-WL31. Therefore, in the row-system signal driving circuit 20, the decoder/driver (CGDEC·DRV) 26 for driving a word line and driver (CGDDRV, CGSDRV) 24, 25 for driving a dummy word line WLDD, WLDS are different from each other in that the former contains a decoder while the latter does not contain a decoder.

Figure 3:
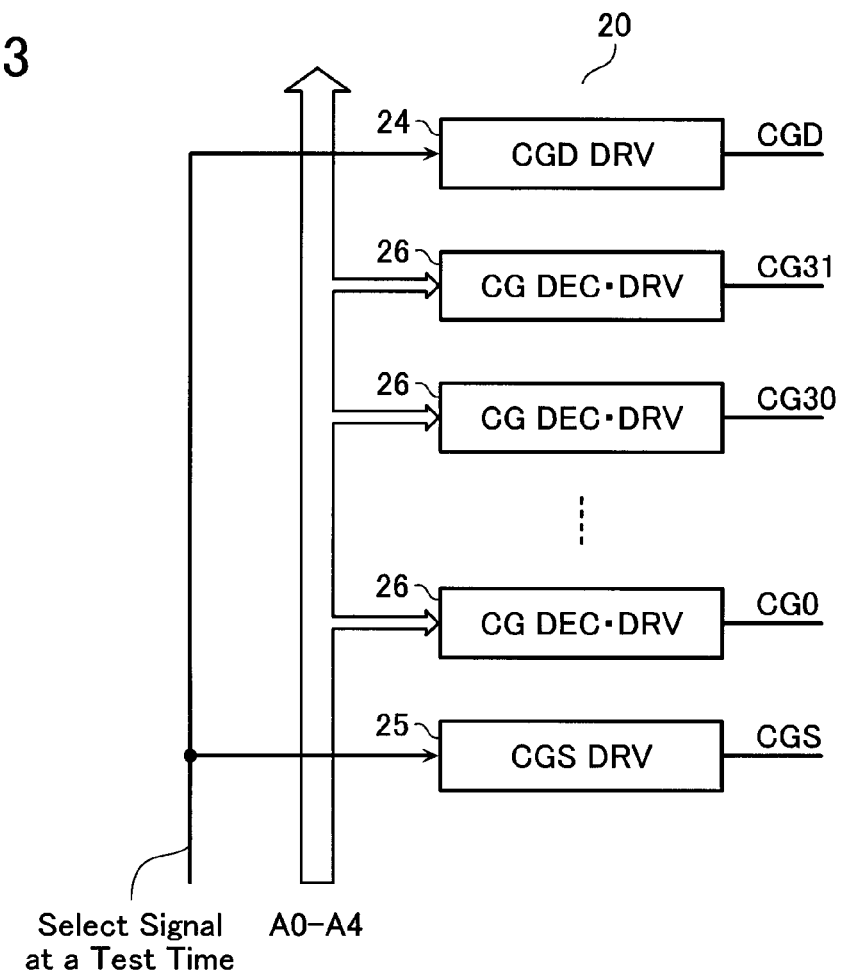
FIG. 3 shows the address input of a row-system signal driving circuit of the flash memory.

FIG. 3 shows a difference between address signal inputs to the word line drive-use decoder/drivers (CGDEC·DRV) 26 and the dummy word line drive-use drivers (CGDDRV, CGSDRV) 24, 25. For example, assuming that address signal bits are A0-A4 for selecting one of 32 word lines, there are disposed decoders for decoding these address bits A0-A4 in the decoder/drivers (CGDEC·DRV) 26.

While, normal address signal bits are not input to the drivers (CGDDRV, CGSDRV) 24, 25 for driving the dummy word lines, and these drivers are controlled to be always activated when the corresponding block is selected. Further, at a test time necessary for selecting a dummy word line, a test-use select signal generated based on a command (or an exclusive address signal) is input to these drivers.

Figure 4:
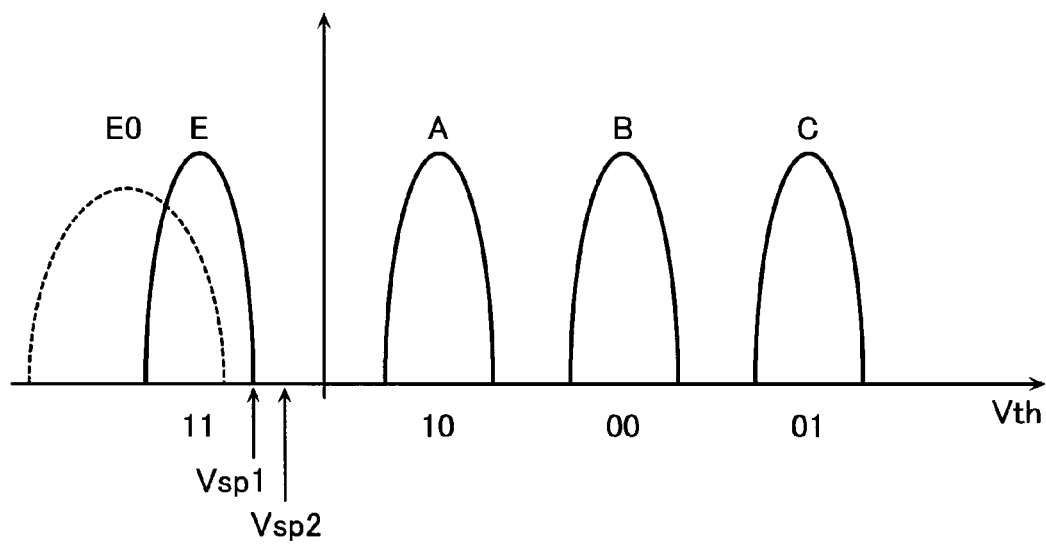
FIG. 4 shows the data threshold distribution in case of a 4-level data storage scheme.

FIG. 4 shows a data threshold distribution in such a case that a four-level data storage scheme is adapted to the NAND-type flash memory in accordance with this embodiment. A memory cell is set in one data state selected from negative threshold voltage state E, three positive threshold voltage states A, B and C. These data states are, for example, defined as the following 4-level data: E=(1, 1), A=(1, 0), B=(0, 0) and C=(0, 1).

Data erase is performed block by block. As shown in FIG. 4 with a dotted line, as erased state E0 includes an over-erase state, which is defined as being shifted over a certain negative threshold level. To dissolve the over-erase state, a so-called soft-program (or soft-write) is performed after collective data erasing, so that data state E will be obtained.

On the other hands, in the data erase mode, the entire memory cells including the dummy cells MCDS, MCDD in a selected block are erased in a lump. Since the dummy cells are not written hereinafter, threshold voltage thereof will be shifted to be more and more negative as the erase operations are repeated. If the dummy cells are also subjected to the soft-program, the above-described situation may be avoided. However, it leads to such a problem that erroneous write occurs at the dummy cells due to a GIDL current.

In consideration of the above-described situation, an erase sequence in accordance with this embodiment will be explained in detail below.

[First Erase Sequence]

In a first erase sequence in accordance with this embodiment, first, dummy cells are excluded from the soft-program target. That is, all memory cells except dummy cells in the NAND strings in a selected block are subjected to the soft-program. As a result, wasteful write disturbance may be avoided unlike the case where dummy cells are also subjected to the soft-program together with memory cells.

Second, prior to a collective erase for the selected block, data program for the dummy cells, i.e., pre-program (or pre-write), is performed for boosting the threshold voltage. This pre-program will prevent the dummy cells from being shifted in threshold voltage in the negative threshold direction as a result of repeating the erase operation.

Figure 5:
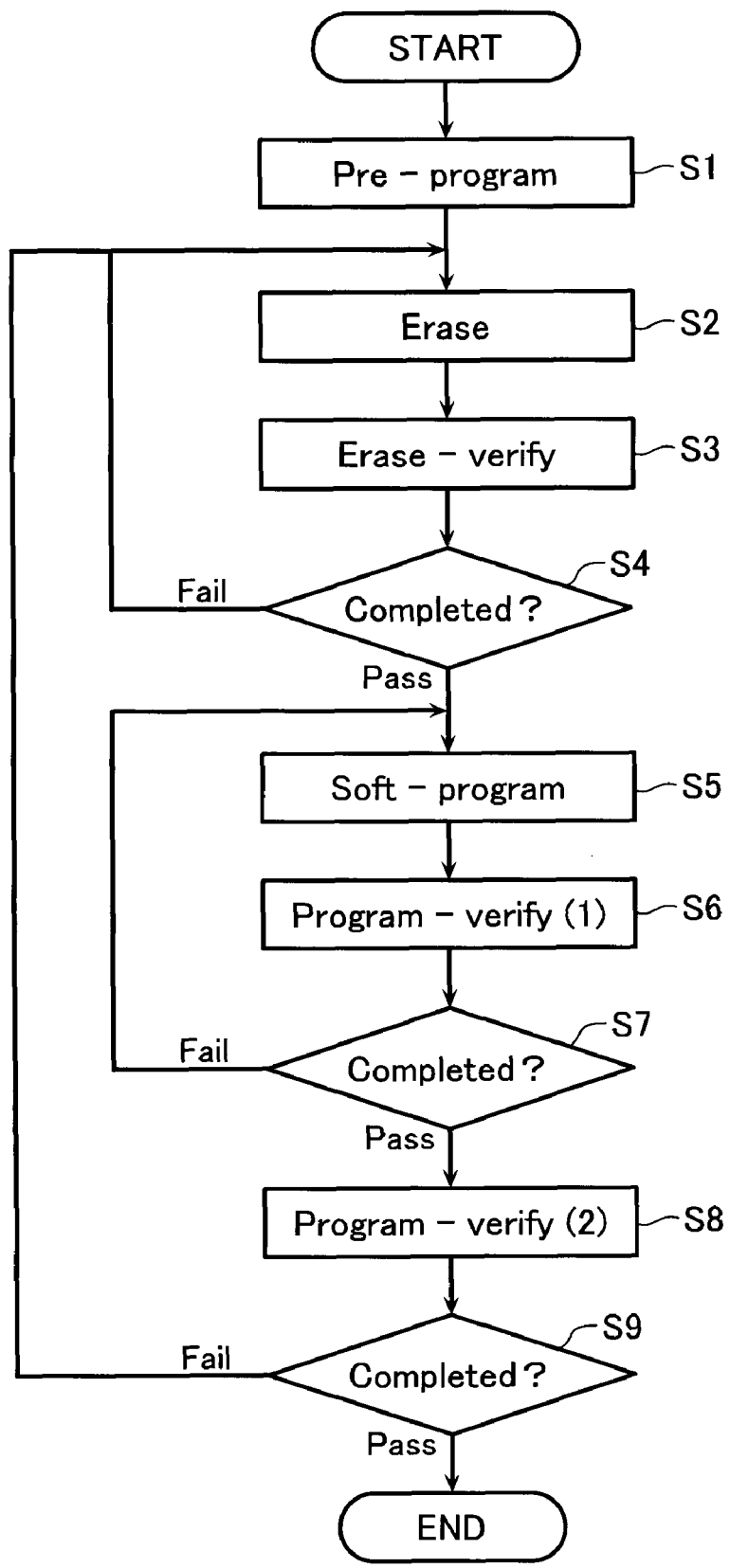
FIG. 5 shows a first erase sequence in accordance with the embodiment.

FIG. 5 shows a flow chart of the first erase sequence. Prior to the collective erase for a selected block, pre-program is performed for the dummy cells to boost threshold voltage thereof (step S1).

Figure 6:
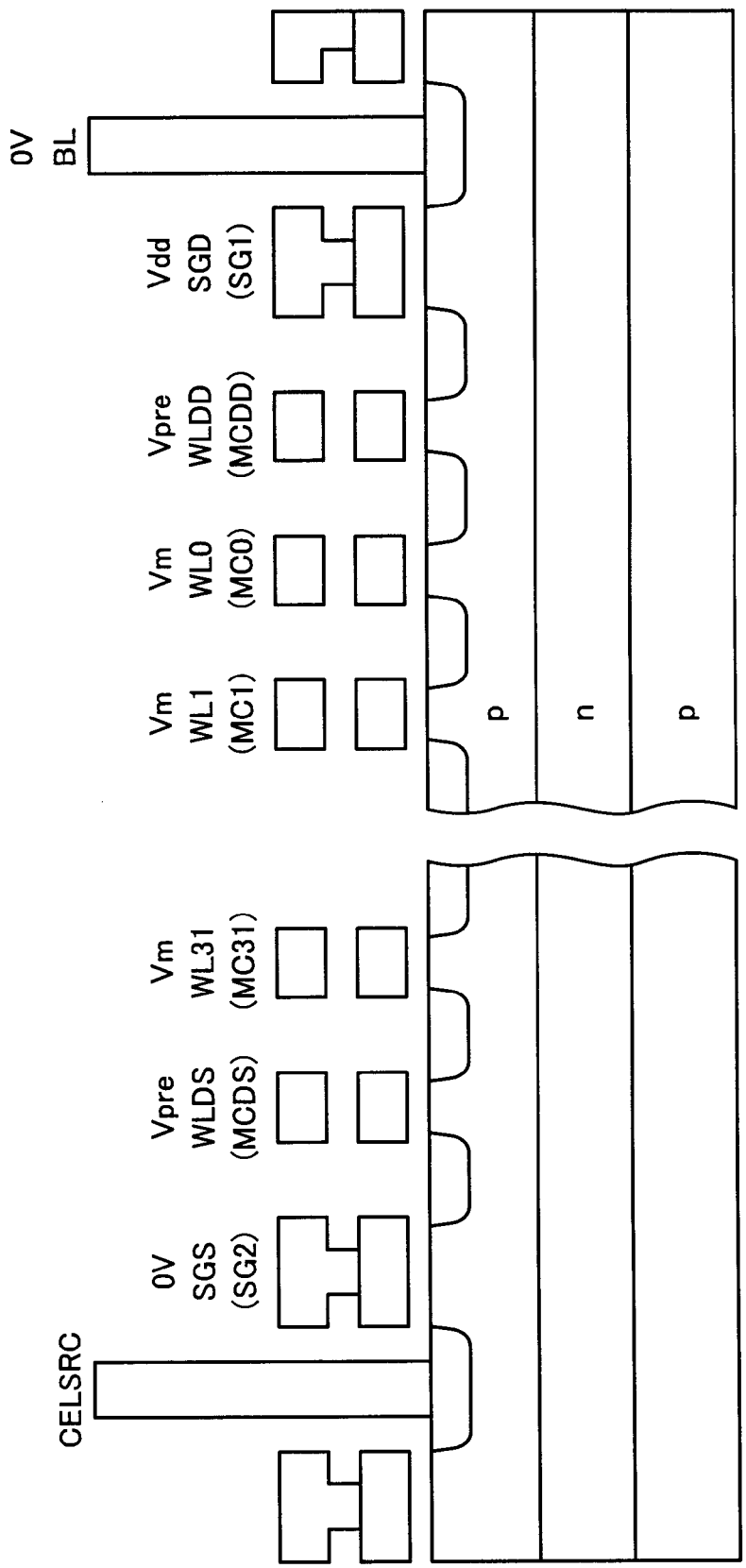
FIG. 6 shows the voltage application condition at the pre-program time.

FIG. 6 shows a voltage application condition in a NAND string at the pre-program time. Word lines WL0-WL31 are applied with program (or write) pass voltage Vm; and dummy word lines WLDD and WLDS with program (or write) voltage Vpre (>Vm). Bit line side select gate line SGD is applied with the power supply voltage Vdd, so that Vss(=0V) of the bit line is transferred to cell channels of the NAND string. As a result, electrons are injected into floating gates of the dummy cells MCDD and MCDS.

This pre-program is for preventing the dummy cells from being shifted in threshold voltage in the negative threshold direction at the following collective erase time, and executed only once without program-verify operations. The program voltage Vpre may be set to be equal to the normal program voltage Vpgm or different from it.

Figure 7:
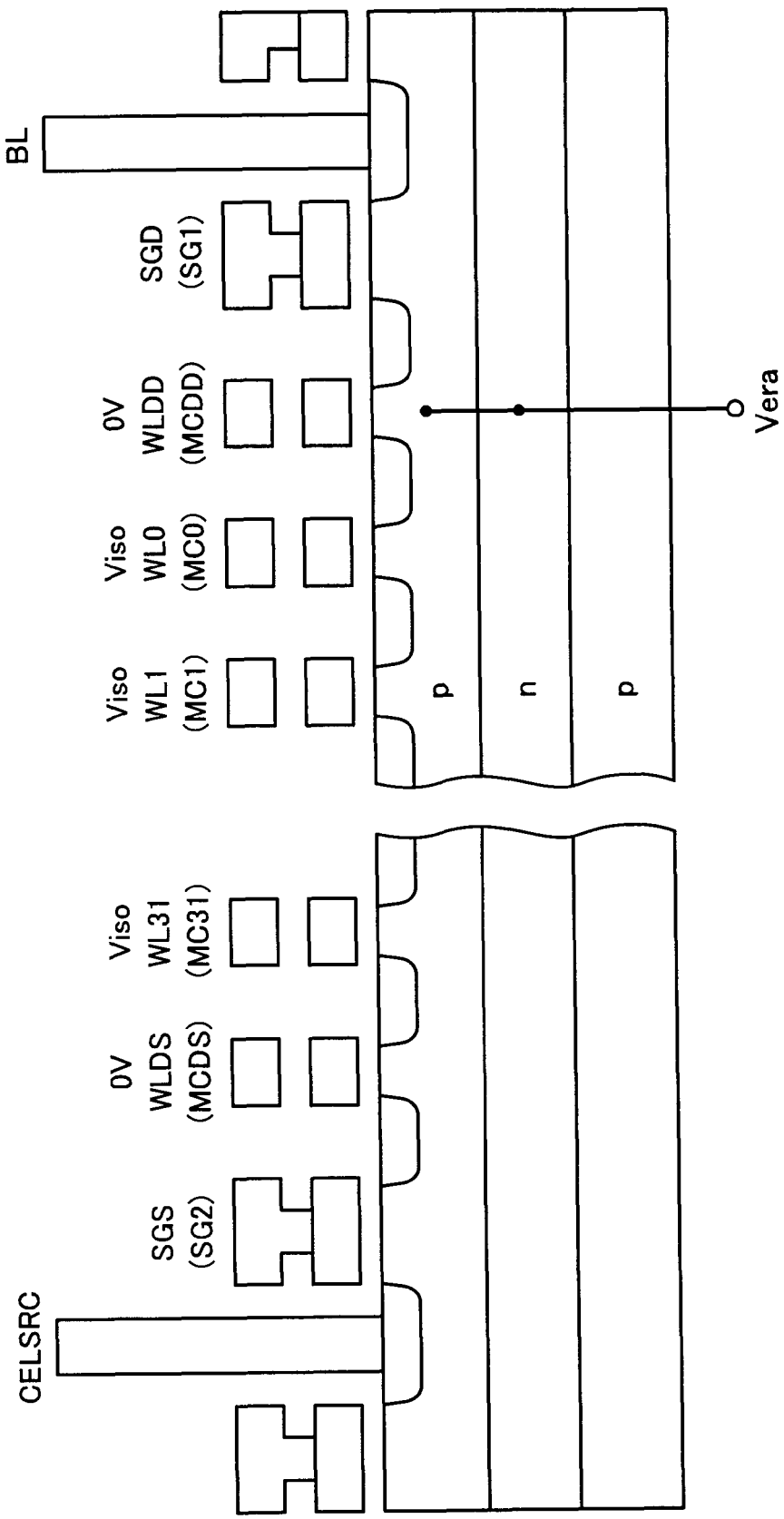
FIG. 7 shows the voltage application condition at the erase time.

Following it, the selected block is erased in a lump (step S2). FIG. 7 shows a voltage application condition in a NAND string at this erase time. Dummy word lines WLDD and WLDS are applied with 0V; word lines WL0-WL31 are applied with Viso, for example about 0.5V; and P-type well, on which the cell array is formed, is applied with erase voltage Vera.

With these voltage applications, electron discharge occurs in the floating gates of all cells. Applied with positive voltage Viso, the normal cells MC0-MC31 have a little later erase speed than that of dummy cells MCDD and MCDS, so that the threshold shift to the negative threshold voltage direction of memory cells will be suppressed.

Figure 8:
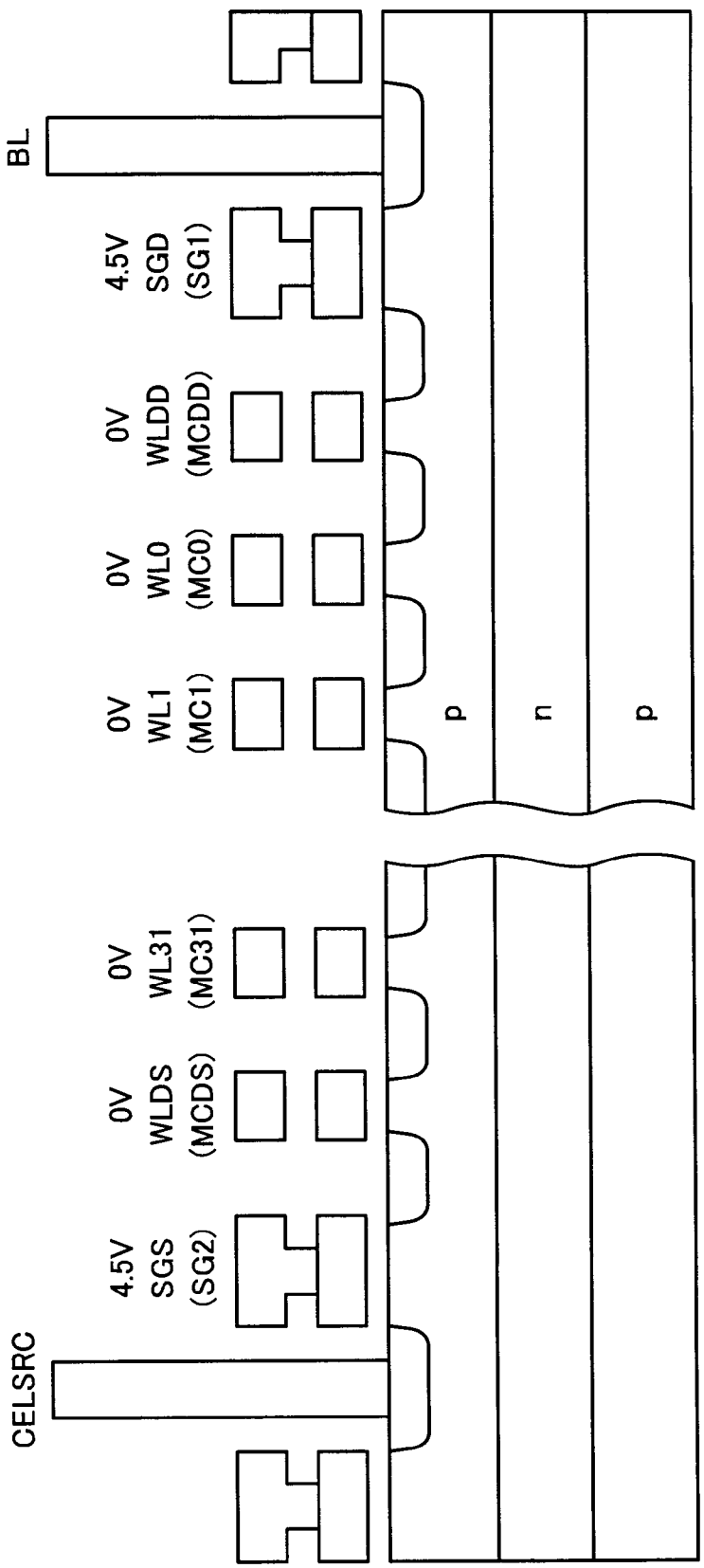
FIG. 8 shows the voltage application condition at the erase-verify time.

After the erase voltage application, erase-verify is performed (step S3). FIG. 8 shows a voltage application condition in a NAND string at this erase-verify time. The entire word lines including dummy word lines are set at 0V; and select gate lines SGD and SGS are set at 4.5V. Under this bias condition, it is detected whether each NAND string becomes through or not, i.e., whether each precharged bit line is discharged or not.

In consideration of the permissible fail numbers, it is judged whether erase has been completed or not (step S4). If not completed, return to the erase step S2 again.

Figure 9:
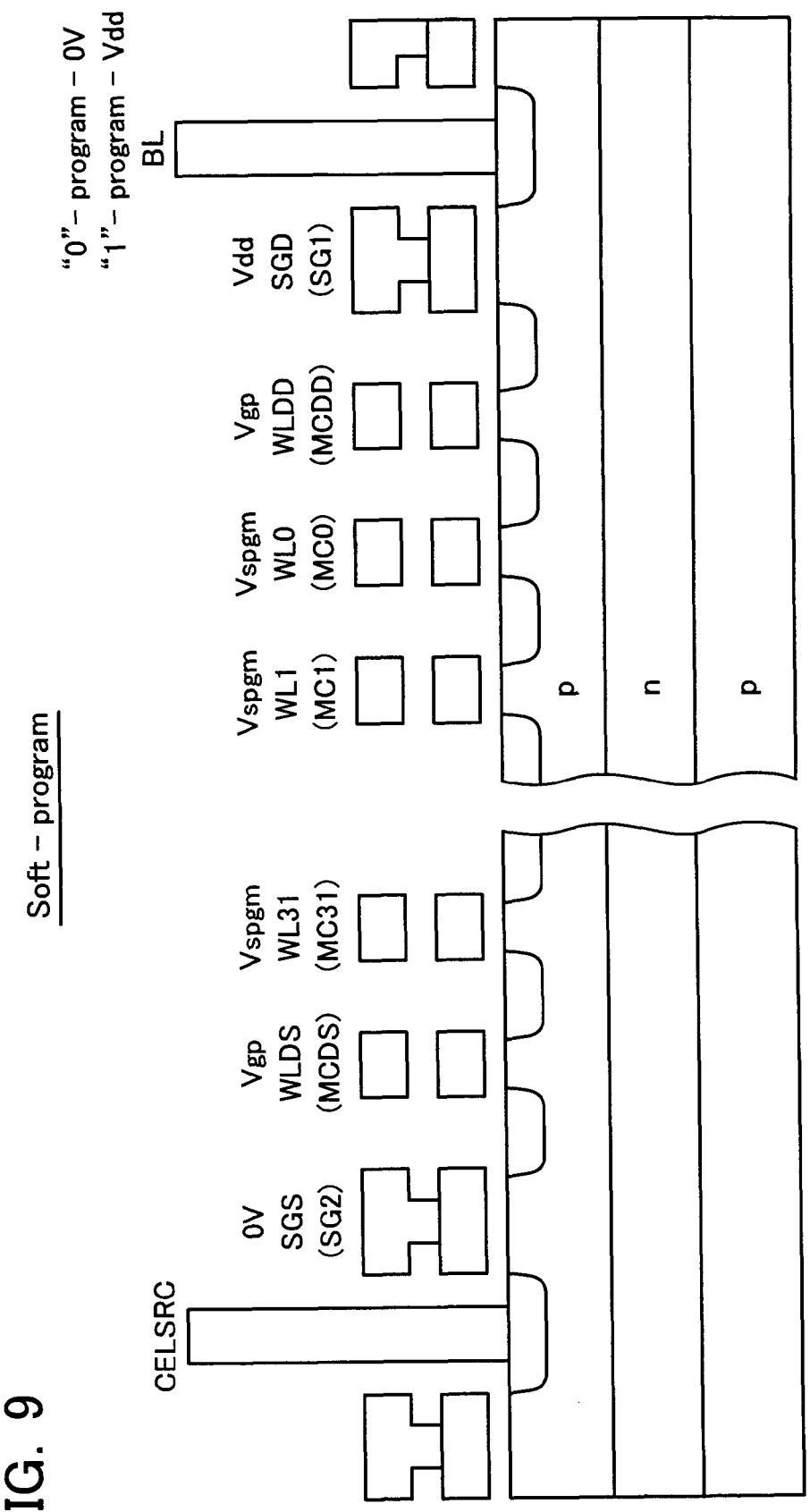
FIG. 9 shows the voltage application condition at the soft-program time.

If erase has passed, soft-program is performed for dissolving the over-erase state of the erased cells (step S5). FIG. 9 shows a voltage application condition in a NAND string at this soft-program time. The entire word lines WL0-WL31 are applied with program voltage Vspgm; dummy word lines WLDD and WLDS are applied with program pass voltage Vgp that is lower than Vspgm; and NAND string channels are set at 0V that is transferred from bit lines.

As a result, electron injection occurs at the floating gates of the entire memory cells. In a NAND string, which has passed the soft-program-verify, the corresponding bit line is applied with Vdd, and the NAND string is set in a "1" write state (i.e., write inhibited state). At this time, voltage Vgp applied to the dummy word lines WLDD and WLDS is set to be lower than Vspgm, and this will prevent the dummy cells from being erroneously written due to the GIDL current.

Figure 10:
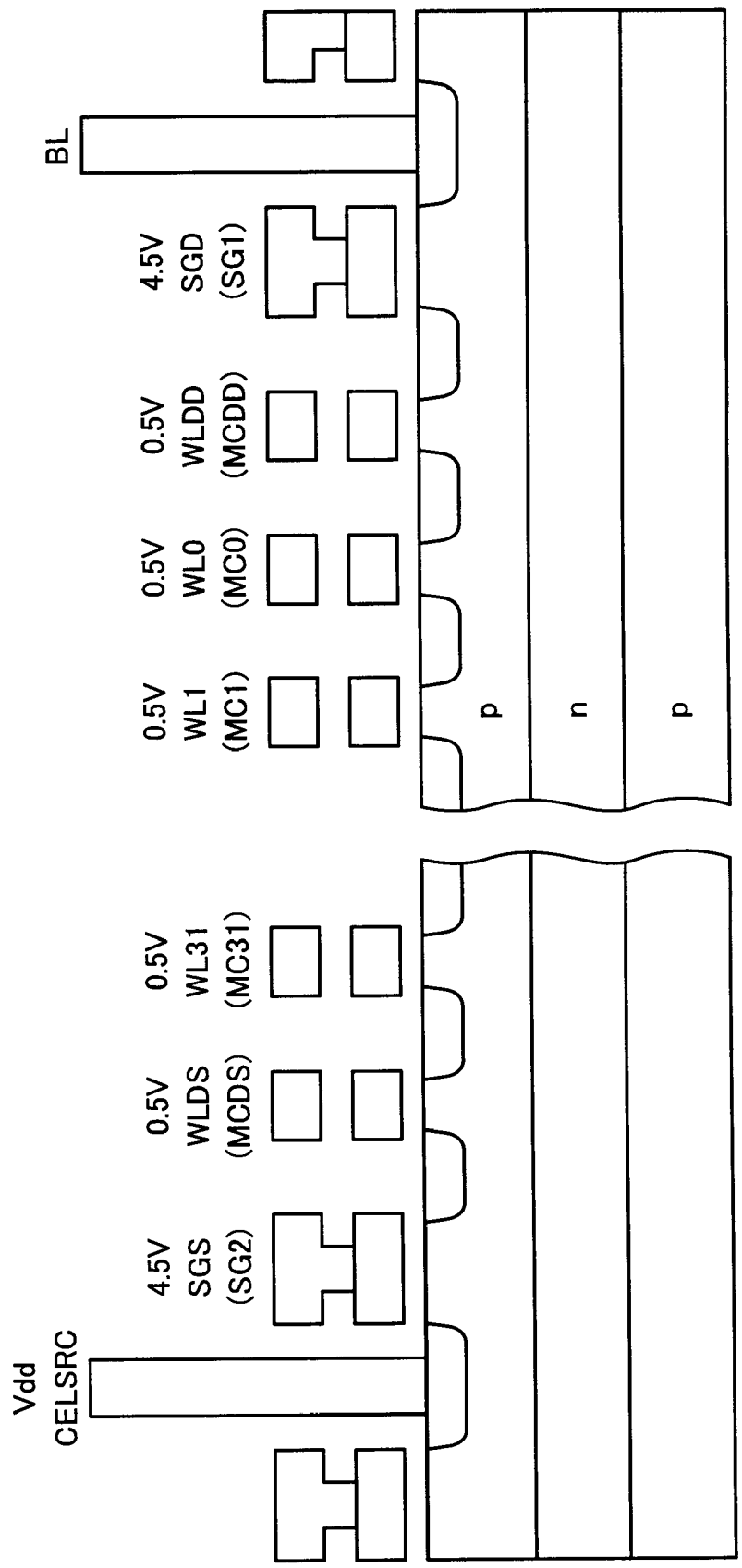
FIG. 10 shows the voltage application condition at the soft-program-verify time.

Then, soft-program-verify is performed (step S6). FIG. 10 shows a voltage application condition in a NAND string at this soft-program-verify time. At this program-verify time, it is used such a source follower operation that cell current is carried from the source line CERSRC to the bit line BL for verifying the negative threshold state of cells. That is, as shown in FIG. 10, the entire word lines including the dummy word lines are applied with about 0.5V; and select gate lines SGD and SGS are applied with 4.5V that is able to sufficiently turn on the select gate transistors. Under this bias condition, apply Vdd to the common source line CERSRC, and detect the charged-up level of the bit line BL.

At the verify-judge step S7, for example as shown in FIG. 4, detecting that the number of erased NAND strings in the E state, threshold voltage of which is over Vsp1, is over a certain value, it is judged as verify passed. In case of verify fail, the program voltage Vspgm is stepped-up, and soft-program will be performed again (step S5).

If the verify-judge step S7 is passed, perform the following soft-program-verify (step S8). This is for verifying that the entire cells with data state E have been finally set under the threshold voltage Vsp2(>Vsp1). In case the soft-program is verified as being over-programmed, the verify-judge step S9 fails, so that the sequence is returned to the erase step S2.

As described above, according to this embodiment, prior to the collective erase of a block, dummy cells are subjected to pre-program for boosting the threshold voltage. As a result, the threshold voltage shift of the dummy cells due to repeated erase operations may be suppressed.

In addition, since the dummy cells are excluded from the soft-program target after erasing, it will be avoided that a wasteful program disturbance occurs in case the soft-program is performed for dummy cells together with the memory cells.

Figure 11:
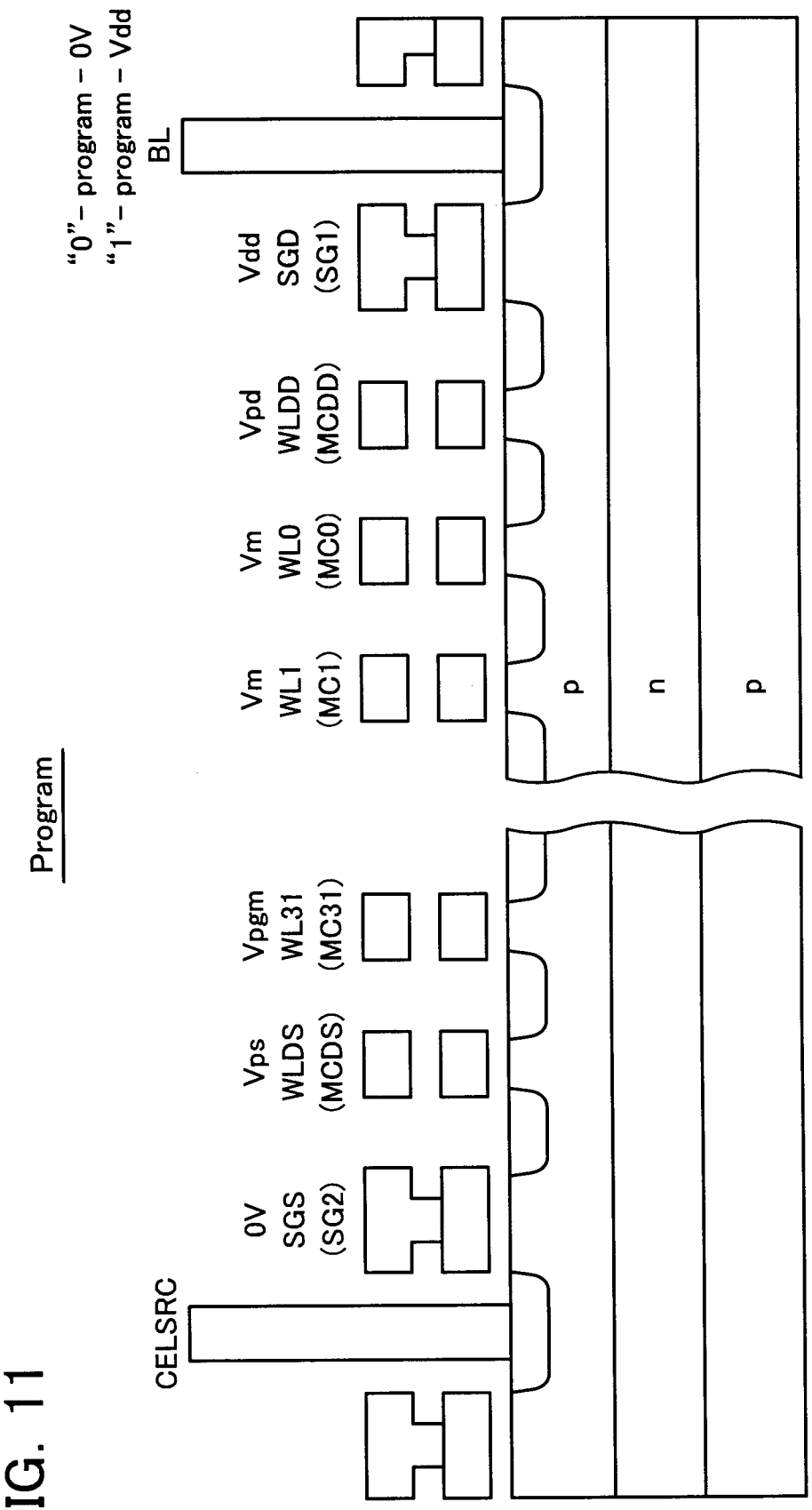
FIG. 11 shows the voltage application condition at the program time.

FIG. 11 shows a voltage applying condition at a normal program time with respect to such a case that word line WL31 nearest the common source line CELSRC is selected. Applied to the bit line BL is: 0V in case of "0" program; and Vdd in case of "1" program (i.e., program-inhibited).

The selected word line WL31 is applied with program voltage Vpgm; non-selected word lines WL0-WL30 with program pass voltage Vm (<Vpgm); dummy word lines WLDD and WLDS with program pass voltage Vpd and Vps lower than Vm; bit line side select gate line SGD with Vdd; and source line side select gate line SGS with 0V.

Under the bias condition, in case of "0" program, electron injection occurs in the floating gate of memory cell MC31 selected by the word line WL31, while in case of "1" program, the NAND string channel is boosted and electron injection does not occur.

If there is no dummy word line adjacent to the selected word line WL31 with program voltage Vpgm applied, in case of "1" program, GIDL current will be generated near the drain edge of the select gate transistor SG2, and this leads to erroneous program of memory cells MC31. In this embodiment, dummy cell MCDS is disposed between the select gate transistor SG2 and the memory cell MC31, so that the above-described erroneous program due to the GIDL current may be avoided.

Further, setting the voltage Vps applied to the dummy word line WLDS to be a suitable value, erroneous program at the dummy cell MCDS and influences thereof to the select gate transistor will be avoided. Similarly, setting the voltage Vpd applied to the dummy word line WLDD to be a suitable value, dummy cell MCDD on the bit line side will also be prevented.

[Second Erase Sequence]

Figure 12:
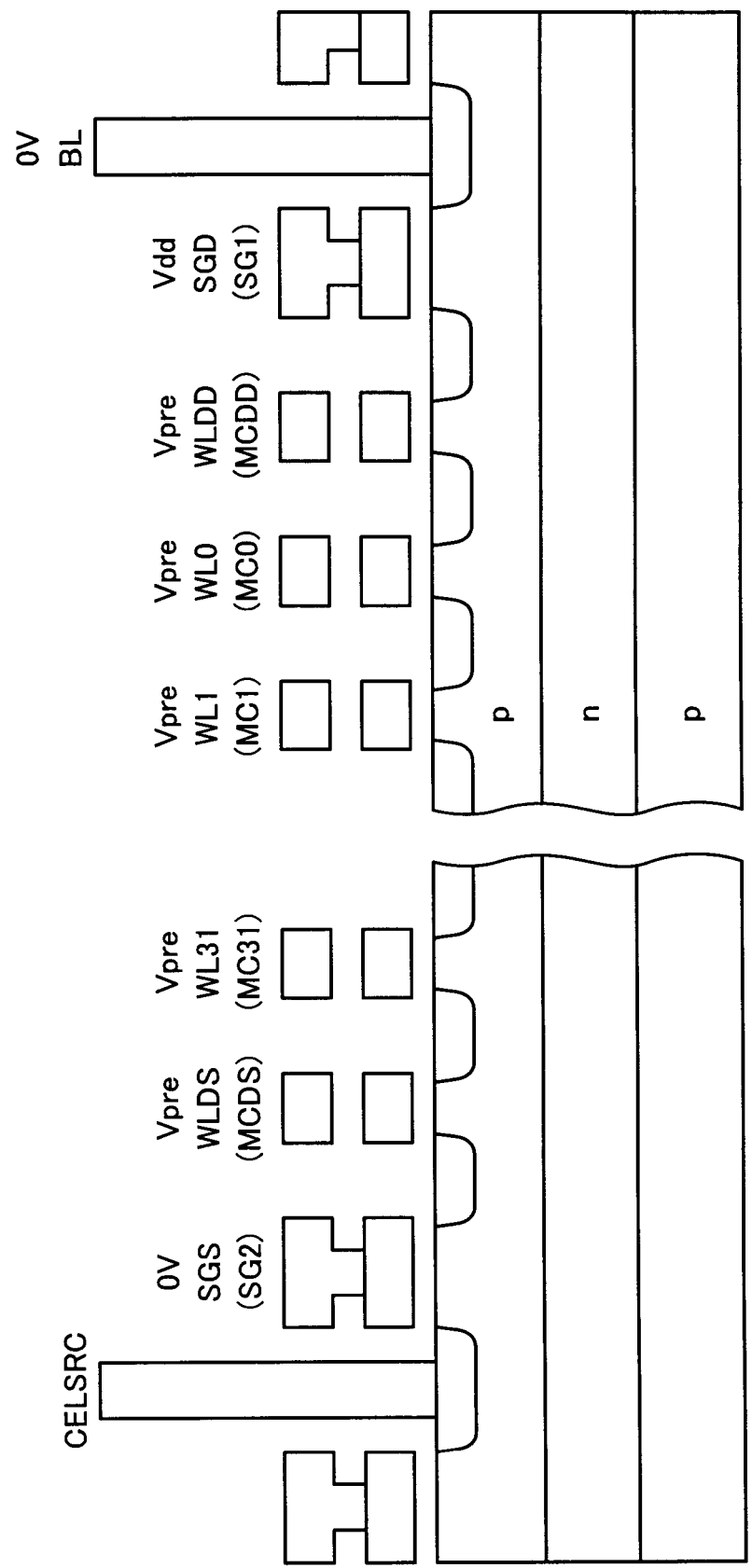
FIG. 12 shows the voltage application condition at the per-program in a second erase sequence.

In the first erase sequence, as shown in FIG. 6, program voltage Vpre is applied to only the dummy cells MCDD and MCDS. By contrast, it is also effective, as shown in FIG. 12, to perform the pre-program for the entire memory cells including the dummy cells.

The others in this second erase sequence are the same as the above-described first erase sequence.

According to this sequence, the threshold voltage of the memory cells with data state E are boosted together with that of the dummy cells, and these threshold voltages may be equalized. Therefore, it becomes possible to suppress the over-program generation in the successive erase operations.

[Third Erase Sequence]

In case the dummy cells are subjected to soft-program together with the memory cells, it is effective to limit the number of soft-program cycles of the dummy cells to a certain level less than that of other memory cells. This third erase sequence will be explained in detail with reference to FIG. 13.

Figure 13:
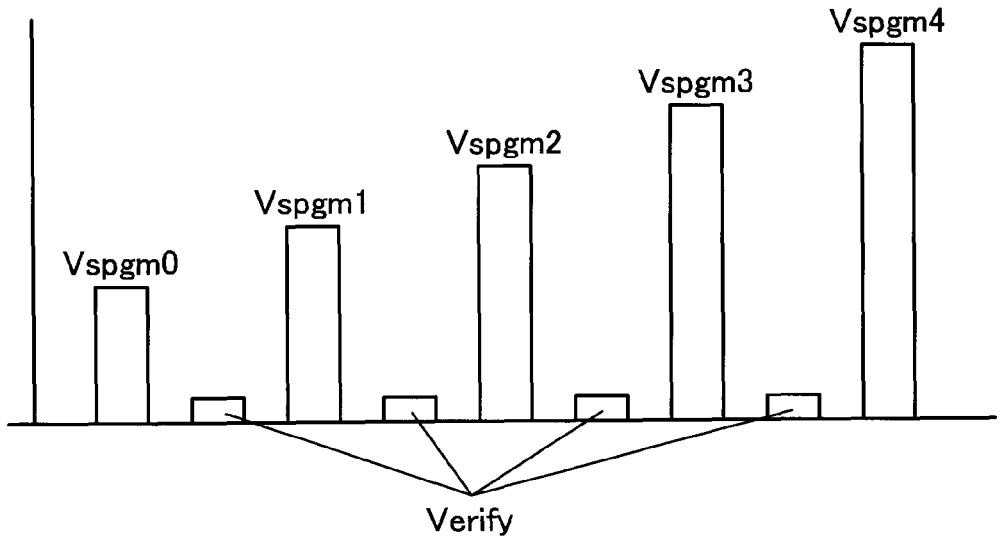
FIG. 13 shows the program voltage waveforms in a third erase sequence.
Figure 13:
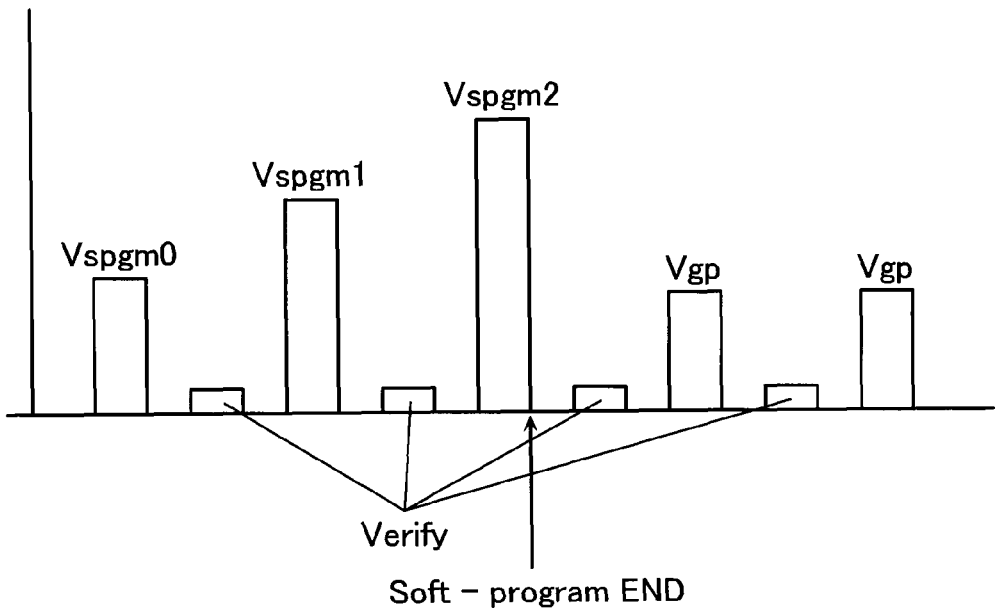

As described above, the soft-program is performed with a step-up program scheme like the normal program. That is, as shown in FIG. 13, the program voltage is stepped-up by $\Delta V$ at each cycle as follows: firstly, the initial program voltage Vspgm0 is applied, and following it stepped-up program voltages (Vspgm1, Vspgm2, . . . ) are successively applied.

In this case, with respect to the memory cells MC0-MC31, a large number of program cycles are prepared, or the number of program cycles is set to be without limit. By contrast, with respect to the dummy cells MCDS, MCDD, it is used the same step-up program scheme as the memory cells within the limits of less program cycles (for example, the number of program pulse applications is limited to three).

With respect to the dummy cells, after the soft-programming, apply low voltage Vgp to prevent them from being written similar to the first erase sequence explained above (FIG. 9). The remaining is the same as in the first erase sequence.

As described above, the soft-program of the dummy cells being performed within a limit of program cycles, the influences of the dummy cells due to the GIDL current will be suppressed as being less like the case soft-program is not used for the dummy cells.

[Fourth Erase Sequence]

It is effective that not only the second erase sequence is adapted but also the third erase sequence is adapted. That is, at the pre-program step S12, as shown in FIG. 12, program voltage Vpre is applied to the normal word lines and the dummy word lines to program the memory cells and dummy cells. In addition, at the soft-program step, as shown in FIG. 13, the dummy cells are subjected to the step-up program scheme like the normal cells under the condition that the dummy cells program is performed within a limit of program cycles.

As a result, the influences on the dummy cells due to the GIDL current will be suppressed, and it becomes possible to prevent the dummy cells from being over-erased.

[Application Devices]

As an embodiment, an electric card using the non-volatile semiconductor memory devices according to the above-described embodiments of the present invention and an electric device using the card will be described bellow.

Figure 14:
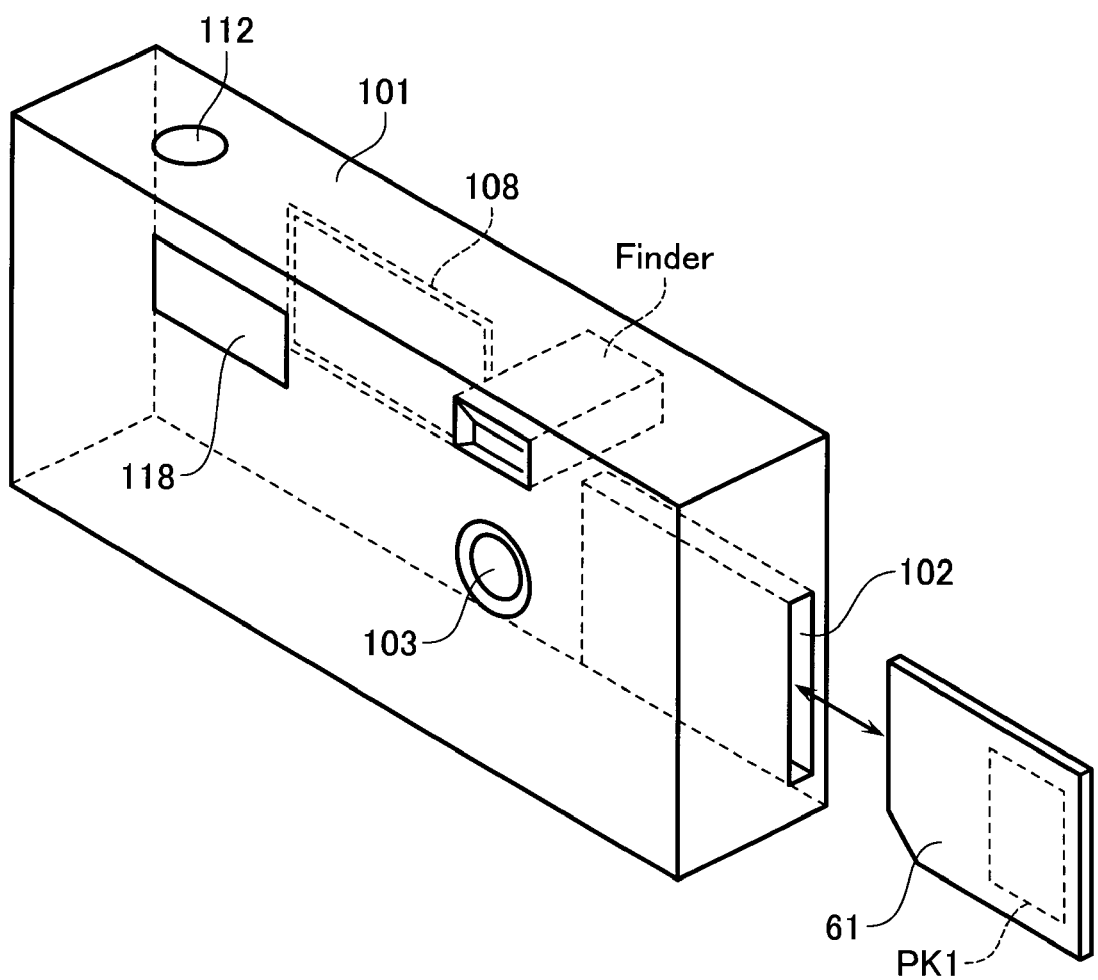
FIG. 14 shows another embodiment applied to a digital still camera.

FIG. 14 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 15:
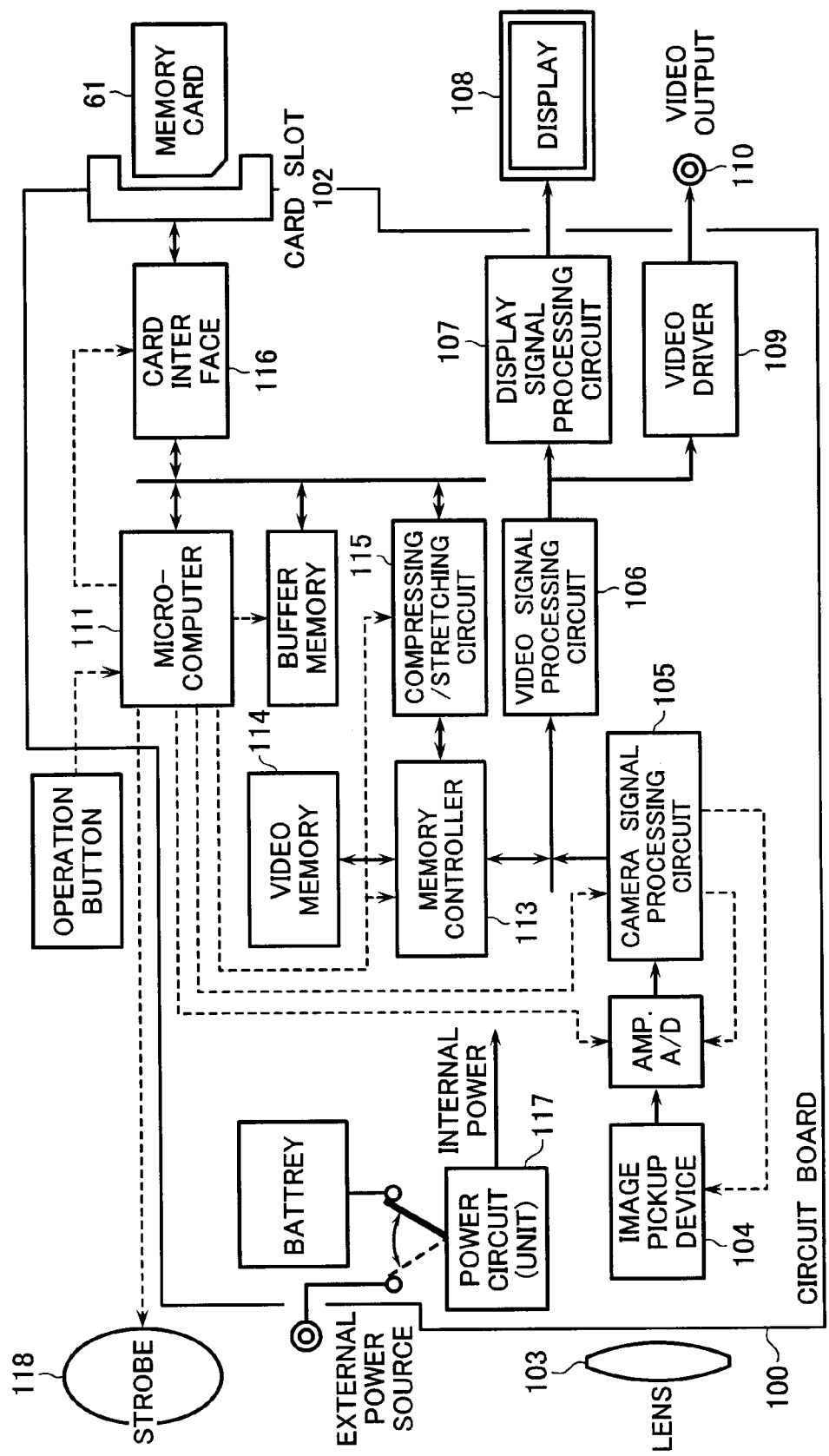
FIG. 15 shows the internal configuration of the digital still camera.
Figure 16A:
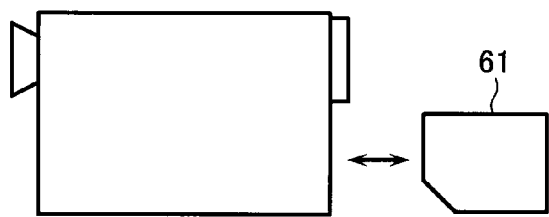
FIGS. 16A to 16J show other electric devices to which the embodiment is applied.
Figure 16F:
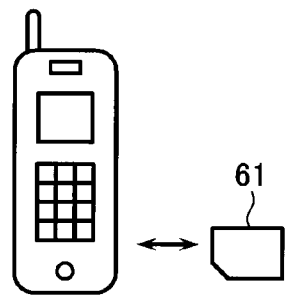
Figure 16B:
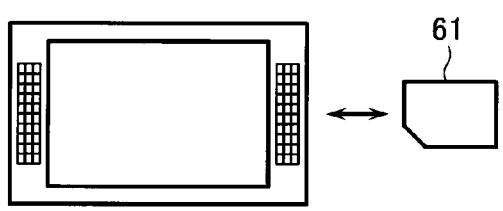
Figure 16G:
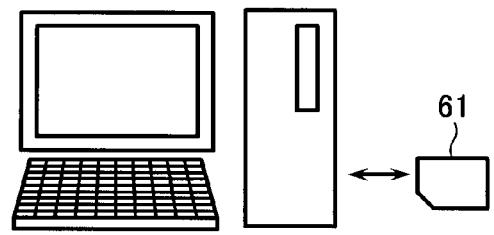
Figure 16C:
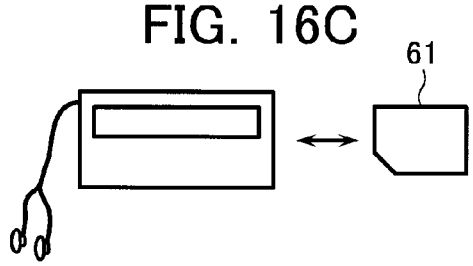
Figure 16H:
Figure 16D:
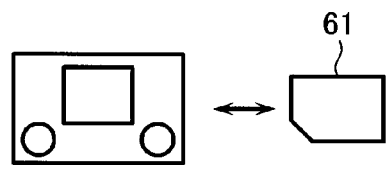
Figure 16I:
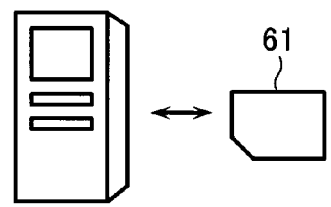
Figure 16E:
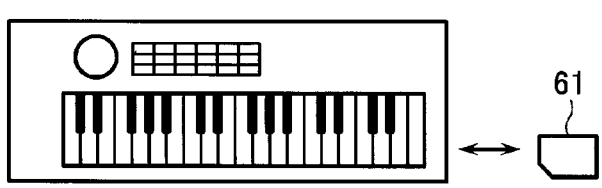
Figure 16J:
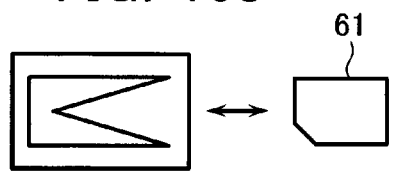

FIG. 15 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 16A to 16J, as well as in portable electric devices. That is, the electric card can also be used in a video camera shown in FIG. 16A, a television set shown in FIG. 16B, an audio apparatus shown in FIG. 16C, a game apparatus shown in FIG. 16D, an electric musical instrument shown in FIG. 16E, a cell phone shown in FIG. 16F, a personal computer shown in FIG. 16G, a personal digital assistant (PDA) shown in FIG. 16H, a voice recorder shown in FIG. 16I, and a PC card shown in FIG. 16J.

This invention is not limited to the above-described embodiment. It will be understood by those skilled in the art that various changes in form and detail may be made without departing from the spirit, scope, and teaching of the invention.

What is claimed is:

1. A semiconductor memory device comprising:
    a memory cell array with NAND cell units arranged therein, the NAND cell unit having a plurality of electrically rewritable and non-volatile memory cells connected in series, first and second select gate transistors disposed for coupling the both ends of the NAND cell unit to a bit line and a source line, respectively, and a dummy cell disposed adjacent to at least one of the first and second select gate transistors, and
    a sequence controller configured to control the memory cell array such that
    prior to erasing the memory cells and the dummy cell in an erase unit, at least the dummy cell is subject to pre-program for boosting threshold voltage thereof as a part of an erase sequence, and
    after erasing the memory cells and the dummy cell in the erase unit, the memory cells are applied with a first program voltage to be subject to soft-program, and the dummy cell is applied with a first program pass voltage lower than the first program voltage as part of the erase sequence, and
    after the erase sequence, a selected memory cell in the memory cells is applied with a second program voltage to be subject to program, non-selected memory cells in the memory cells are applied with a second program pass voltage lower than the second program voltage, and the dummy cell is applied with a third program pass voltage lower than the second program pass voltage.

2. The semiconductor memory device according to claim 1, wherein
    there are dummy cells disposed adjacent to the first and second select gate transistors, and wherein
    prior to erasing the memory cells and the dummy cells in the erase unit, the dummy cells are subject to pre-program for boosting threshold voltage thereof.

3. The semiconductor memory device according to claim 2, wherein
    the pre-program is performed by only one program voltage application without a program-verify operation.

4. The semiconductor memory device according to claim 1, wherein
    prior to erasing the memory cells and the dummy cell in the erase unit, the memory cells and the dummy cell are subject to pre-program for boosting threshold voltage thereof.

5. The semiconductor memory device according to claim 4, wherein
    the pre-program is performed by only one program voltage application without a program-verify operation.

6. The semiconductor memory device according to claim 1, wherein
    the soft-program is based on a step-up program scheme, in which program voltage applications and program-verify operations are repeated.

7. A method for operating a semiconductor memory device comprising a memory cell array with NAND cell units arranged therein, the NAND cell unit having a plurality of electrically rewritable and non-volatile memory cells connected in series and a dummy cell disposed adjacent to a select gate transistor at one end of the NAND cell unit, including an erase sequence, wherein the erase sequence comprising:
    pre-programming at least the dummy cell in an erase unit for boosting threshold voltage thereof;
    erasing the memory cells and the dummy cell in the erase unit; and
    soft-programming the memory cells in the erase unit by applying a program voltage to the memory cells while applying a program pass voltage lower than the program voltage to the dummy cell.

8. The method according to claim 7, wherein
    the pre-programming procedure is performed by only one program voltage application without a program-verify operation.

9. The method according to claim 7, wherein
    the soft-programming procedure is based on a step-up program scheme, in which program voltage applications and program-verify operations are repeated.

10. The method according to claim 7, further including:
    programming after the erase sequence by applying a second program voltage to a selected memory cell in the memory cells;
    applying a second program pass voltage lower than the second program voltage to non-selected memory cells in the memory cells; and
    applying a third program pass voltage lower than the second program pass voltage to the dummy cell.

* * * * *